United States Patent
Kuraoka et al.

(10) Patent No.: US 10,541,514 B2
(45) Date of Patent: Jan. 21, 2020

(54) SURFACE-EMITTING DEVICE, VERTICAL EXTERNAL-CAVITY SURFACE-EMITTING LASER, AND METHOD FOR MANUFACTURING SURFACE-EMITTING DEVICE

(71) Applicant: NGK INSULATORS, LTD., Aichi (JP)

(72) Inventors: Yoshitaka Kuraoka, Okazaki (JP); Kentaro Nonaka, Gifu (JP); Tomohiko Sugiyama, Nagoya (JP); Takashi Yoshino, Ama (JP)

(73) Assignee: NGK INSULATORS, LTD., Aichi (JP)

( * ) Notice: Subject to any disclaimer, the term of this patent is extended or adjusted under 35 U.S.C. 154(b) by 0 days.

(21) Appl. No.: 15/428,236

(22) Filed: Feb. 9, 2017

(65) Prior Publication Data

US 2017/0250519 A1    Aug. 31, 2017

(30) Foreign Application Priority Data

Feb. 25, 2016  (JP) ................... 2016-034005
Mar. 3, 2016   (JP) ................... 2016-040853

(51) Int. Cl.
*H01S 5/343* (2006.01)
*H01S 5/04* (2006.01)
(Continued)

(52) U.S. Cl.
CPC ...... *H01S 5/34333* (2013.01); *H01L 21/2015* (2013.01); *H01S 5/041* (2013.01);
(Continued)

(58) Field of Classification Search
CPC ........................... H01S 5/3201; H01S 5/3202
See application file for complete search history.

(56) References Cited

U.S. PATENT DOCUMENTS

| | | | |
|---|---|---|---|
| 6,097,742 A | 8/2000 | Caprara et al. | |
| 7,083,099 B2 | 8/2006 | Schmid | |

(Continued)

FOREIGN PATENT DOCUMENTS

| | | |
|---|---|---|
| JP | 2002-223042 A | 8/2002 |
| JP | 2006-113591 A | 4/2006 |

(Continued)

OTHER PUBLICATIONS

"Sapphire Advantage: Low-Noise," Coherent Japan, Inc., http://www.coherent.co.jp/document/whitepaper/asscw/20110214_Sapphire_Advantage_Low_Noise.pdf (accessed Feb. 10, 2016).

(Continued)

*Primary Examiner* — Tod T Van Roy
(74) *Attorney, Agent, or Firm* — Cermak Nakajima & McGowan LLP; Tomoko Nakajima

(57) ABSTRACT

A vertical external-cavity surface-emitting laser (VECSEL) whose blueshift is reduced also in a high intensity range of emitted laser light is realized. A surface-emitting device for VECSEL includes a base substrate made of GaN and c-axis oriented, and an emitter structure formed of a group 13 nitride semiconductor and provided on the base substrate. The emitter structure is formed of unit deposition parts, each of which is provided on the base substrate and includes a DBR layer having a distributed Bragg reflection structure and an active layer that has a multiple quantum well structure and generates excitation emission in response to irradiation with external laser light. A c-axis orientation of each of the unit deposition parts conforms to the c-axis orientation of the base substrate located directly below the unit deposition parts. Grooves are formed between the unit deposition parts.

19 Claims, 6 Drawing Sheets

(51) Int. Cl.
*H01S 5/183* (2006.01)
*H01S 5/14* (2006.01)
*H01S 5/32* (2006.01)
*H01S 5/42* (2006.01)
*H01L 21/20* (2006.01)

(52) U.S. Cl.
CPC .......... *H01S 5/141* (2013.01); *H01S 5/18361* (2013.01); *H01S 5/3201* (2013.01); *H01S 5/3202* (2013.01); *H01S 5/423* (2013.01)

(56) References Cited

U.S. PATENT DOCUMENTS

| | | | |
|---|---|---|---|
| 7,132,691 B1 * | 11/2006 | Tanabe | B82Y 20/00 |
| | | | 257/103 |
| 8,546,167 B2 | 10/2013 | Kato et al. | |
| 9,112,331 B2 | 8/2015 | Northrup et al. | |
| 2002/0011599 A1 | 1/2002 | Motoki et al. | |
| 2002/0053676 A1 | 5/2002 | Kozaki | |
| 2003/0205736 A1 | 11/2003 | Kozaki | |
| 2005/0098789 A1 | 5/2005 | Kozaki | |
| 2006/0038166 A1 * | 2/2006 | Tsuda | B82Y 20/00 |
| | | | 257/13 |
| 2006/0083284 A1 | 4/2006 | Paldus et al. | |
| 2006/0131604 A1 | 6/2006 | Kozaki | |
| 2007/0248132 A1 * | 10/2007 | Kikuchi | B82Y 20/00 |
| | | | 372/44.01 |
| 2008/0029758 A1 | 2/2008 | Kozaki | |
| 2008/0232412 A1 * | 9/2008 | Mizuuchi | H01S 5/14 |
| | | | 372/22 |
| 2009/0194784 A1 * | 8/2009 | Kaji | H01L 33/16 |
| | | | 257/103 |
| 2010/0246624 A1 * | 9/2010 | Hiroyama | B82Y 20/00 |
| | | | 372/45.01 |
| 2010/0252811 A1 | 10/2010 | Kozaki | |
| 2013/0056707 A1 | 3/2013 | Kozaki | |
| 2013/0313567 A1 | 11/2013 | Furuya et al. | |
| 2013/0343420 A1 * | 12/2013 | Northrup | H01S 5/18366 |
| | | | 372/50.11 |
| 2014/0203242 A1 | 7/2014 | Kozaki | |
| 2015/0063393 A1 * | 3/2015 | Iwata | H01S 5/183 |
| | | | 372/45.01 |
| 2015/0144954 A1 | 5/2015 | Georgakilas et al. | |
| 2015/0349496 A1 * | 12/2015 | Miyasaka | H01S 5/164 |
| | | | 372/44.011 |
| 2015/0364649 A1 | 12/2015 | Kozaki | |
| 2016/0254138 A1 | 9/2016 | Kikuchi et al. | |
| 2018/0033911 A1 * | 2/2018 | Fujii | H01L 33/24 |

FOREIGN PATENT DOCUMENTS

| | | | | |
|---|---|---|---|---|
| JP | 2007-201018 A | | 8/2007 | |
| JP | 2008-066591 A | | 3/2008 | |
| JP | 2008-294467 A | | 12/2008 | |
| JP | 2009-123718 A | | 6/2009 | |
| JP | 2010-132556 A | | 6/2010 | |
| JP | 4891462 B2 | | 12/2011 | |
| JP | 2012-184144 A | | 9/2012 | |
| JP | 2012-250868 A | | 12/2012 | |
| JP | 2013-229580 A | | 11/2013 | |
| JP | 2014-183120 A | | 9/2014 | |
| JP | 2017-157732 | * | 9/2017 | ............ H01L 33/18 |
| KR | 10-2005-0086042 A | | 8/2005 | |
| WO | WO2006/025407 A1 | | 3/2006 | |
| WO | WO2014/192911 A1 | | 12/2014 | |
| WO | WO2015/151902 A1 | | 10/2015 | |

OTHER PUBLICATIONS

Office Action from Japanese Patent App. No. 2016-040853 dated Oct. 1, 2019.

* cited by examiner

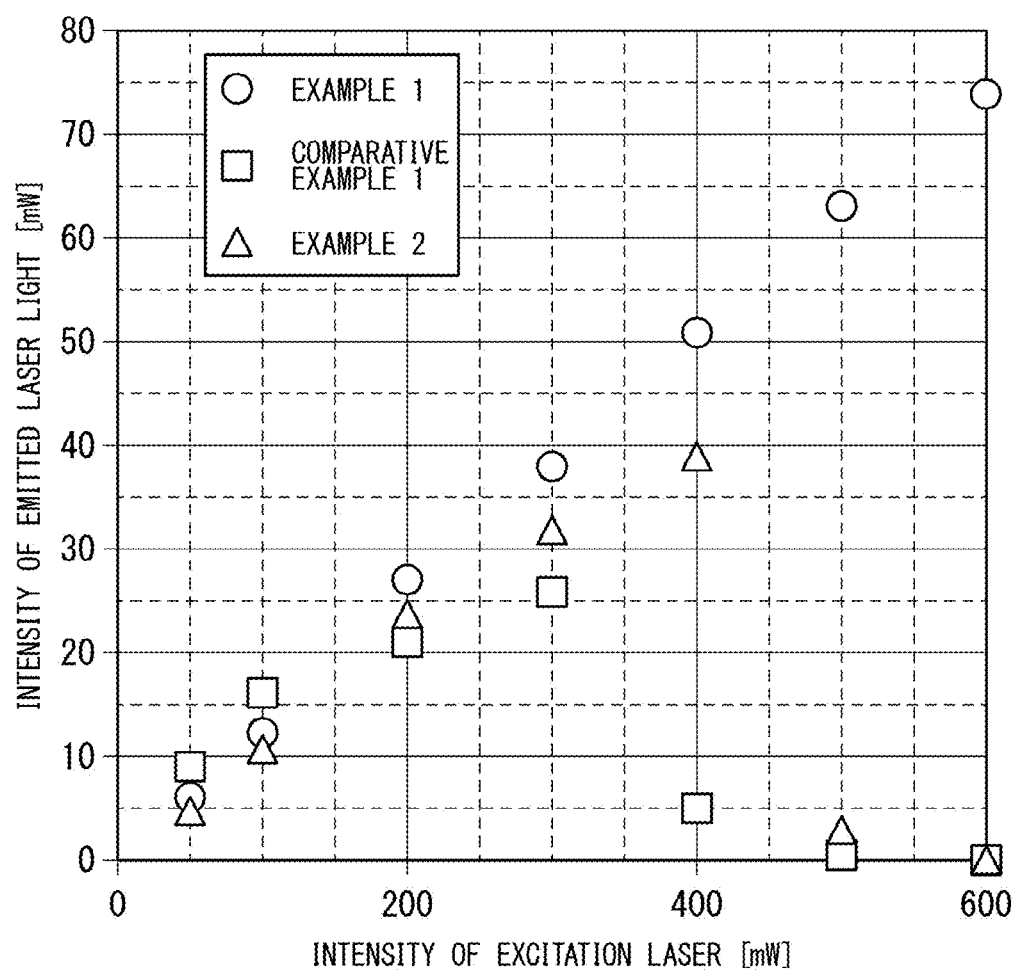
F I G. 6

SURFACE-EMITTING DEVICE, VERTICAL EXTERNAL-CAVITY SURFACE-EMITTING LASER, AND METHOD FOR MANUFACTURING SURFACE-EMITTING DEVICE

BACKGROUND OF THE INVENTION

Field of the Invention

The present invention relates to surface-emitting devices, and particularly, to a surface-emitting device suitable for a vertical external-cavity surface-emitting laser.

Description of the Background Art

As one type of semiconductor laser, vertical external-cavity surface-emitting lasers (VECSELs) have been publicly known (for example, see Japanese Patent Application Laid-Open No. 2008-294467, U.S. Pat. No. 6,097,742, Japanese Patent Application Laid-Open No. 2006-113591, Japanese Patent Application Laid-Open No. 2013-229580, and "Sapphire Advantage: Low-Noise", Coherent Japan, Inc., http://www.coherent.co.jp/document/whitepaper/asscw/20110214_Sapphire_Advantage_Low_Noise.pdf (accessed Feb. 10, 2016, which is hereinafter referred to as Non-Patent Document 1). In outline, a vertical external-cavity surface-emitting laser (VECSEL) is an apparatus having an optical resonator composed of a resonant mirror and a surface-emitting device, which includes deposited active layer having a multiple quantum well (MQW) structure and distributed Bragg reflector (DBR) structure. Excitation laser light is emitted from an excitation laser light source to the surface-emitting device, to cause the surface-emitting device to emit light, and further produces optical resonance between the surface-emitting device and the resonant mirror, thereby producing laser light.

U.S. Pat. No. 6,097,742 and Non-Patent Document 1 each disclose a VECSEL that uses an InGaAs-based semiconductor laser as excitation laser light and an InGaAsP-based semiconductor as a surface-emitting device, and that wavelength-converts emitted infrared laser light by a second harmonic generation (SHG) device to output laser light in visible region.

Japanese Patent Application Laid-Open No. 2006-113591 discloses that laser light of various wavelengths can be produced depending on the designs of a surface-emitting device and an optical resonator.

Japanese Patent Application Laid-Open No. 2013-229580 discloses a surface-emitting device for VECSEL having an MQW structure of InGaN/GaN using a GaN-based semiconductor.

It is publicly known that an oriented alumina substrate is produced by shaping polycrystalline alumina oriented in a c-axis direction into a substrate, and a GaN polycrystalline substrate (oriented GaN substrate) is produced by a method of depositing a gallium nitride on the oriented alumina substrate and orienting the gallium nitride in the c-axis direction (for example, see WO 2014/192911).

A light emitting device in which a main surface of a substrate is a semi-polar surface or non-polar surface other than a c-plane has been publicly known (for example, see Japanese Patent No. 4891462).

A VECSEL is configured by precisely arranging an optical resonator, an SHG device, and a third harmonic generation (THG) device in an apparatus. Stabilizing laser oscillation requires heat dissipation with, for example, a heat sink. The intensity of excitation laser light is conceivably increased to increase a laser output power from the VECSEL. In the case where the intensity of the excitation laser light is increased, however, the surface-emitting device generates more heat, so that an error is likely to occur in the position or optical axis of the optical device. Such an error attenuates the intensity of the laser light emitted from the optical resonator.

The use of an MQW structure including InGaN/GaN as a surface-emitting device can realize laser light in the range of blue to green without an SHG device, which is thus effective in reducing the cost of a VECSEL and increasing the life of the VECSEL. When the intensity of excitation laser light is increased for the VECSEL having an InGaN/GaN MQW structure, however, the following problem arises. More carriers are excited, causing a blueshift (a shift toward a shorter wavelength of an emission wavelength) due to an effect of shielding a piezo electric field inside an active layer. This shifts the wavelength of emitted light from the wavelength designed for a resonator, thus sharply attenuating the intensity of the emitted laser light.

To reduce the blueshift, it is conceivable to apply the technique disclosed in, for example, Japanese Patent No. 4891462 for reducing the polarity of the main surface of the substrate, that is, to use a semi-polar plane or non-polar plane other than the c plane as the main surface of the substrate. However, because an oxygen impurity is easily doped in the crystal, so the intensity of light emission cannot be increased readily.

SUMMARY OF THE INVENTION

The present invention is applied to surface-emitting devices, and particularly, to a surface-emitting device suitable for a vertical external-cavity surface-emitting laser.

According to the present invention, a surface-emitting device for an excitation medium of a vertical external-cavity surface-emitting laser includes a base substrate made of GaN and c-axis oriented, and an emitter structure formed of a group 13 nitride semiconductor and provided on the base substrate. The emitter structure is formed of a plurality of unit deposition parts. Each of the plurality of unit deposition parts is provided on the base substrate and includes a DBR layer having a distributed Bragg reflection structure and an active layer that has a multiple quantum well structure and generates excitation emission in response to irradiation with external laser light. A c-axis orientation of each of the plurality of unit deposition parts conforms to the c-axis orientation of the base substrate located directly below the plurality of unit deposition parts. Grooves are formed between a plurality of unit deposition parts.

According to the present invention, strains inside the surface-emitting device included as an excitation medium in the vertical external-cavity surface-emitting laser are relieved, thereby reducing a blueshift in the surface-emitting device. Thus, a vertical external-cavity surface-emitting laser is achieved, which has high intensity of emitted laser light also in a high-intensity range of emitted laser light.

In a preferred aspect, the base substrate is an oriented polycrystalline substrate made of GaN and c-axis oriented. Each of the plurality of unit deposition parts is provided, on a corresponding crystal among crystals of the oriented polycrystalline substrate, conforming to a c-axis orientation of the corresponding crystal. The grooves are located along grain boundaries on the main surface of the oriented polycrystalline substrate.

According to this aspect, a surface-emitting device is achieved with lower cost and higher productivity than in the use of a single crystal substrate as a base substrate.

In another preferred aspect, the base substrate is a single crystal substrate made of GaN and c-axis oriented.

According to this aspect, the conditions for forming the grooves can be preferably adjusted to optimize the intensity of the emitted laser light.

In still another preferred aspect, each of the unit deposition parts includes a first GaN layer provided on the base substrate, the DBR layer provided on the first GaN layer, the active layer of n type provided on the DBR layer, and a second GaN layer provided on the active layer. The DBR layer has the distributed Bragg reflection structure in which a first unit reflection layer made of a group 13 nitride having a composition $In_xAl_{1-x}N$ (0≤x<1) and a second unit reflection layer made of GaN are deposited repeatedly and alternately. The active layer has the multiple quantum well structure in which a first unit active layer of n type having a composition $In_yGa_{1-y}N$ (0<y<1) and a second unit active layer of n type made of GaN are deposited repeatedly and alternately.

According to this aspect, a surface-emitting device having a reduced blueshift, which has an InGaN/GaN multiple quantum well structure, is achieved.

The present invention therefore has an object to provide a surface-emitting device whose blueshift is reduced for achieving a vertical external-cavity surface-emitting laser in which the intensity of emitted laser light is high also in a high-intensity range of emitted laser light. The present invention has another object to provide a vertical external-cavity surface-emitting laser including the surface-emitting device.

BRIEF DESCRIPTION OF THE DRAWINGS

FIG. 6 is a graph showing a relationship between the intensity of excitation laser light LB0 and the intensity of emitted laser light LB in Example 1, Example 2, and Comparative Example 1;

DESCRIPTION OF THE PREFERRED EMBODIMENTS

The group numbers of the periodic table in this specification are based on the explanation of group numbers 1 to 18 in the nomenclature of inorganic chemistry revised in 1989 by the international union of pure applied chemistry (IUPAC). Group 13 refers to, for example, aluminum (Al), gallium (Ga), and indium (In), and group 15 refers to, for example, nitrogen (N), phosphorous (P), arsenic (As), and antimony (Sb).

First Embodiment

Configuration of Surface-Emitting Device

Figure 1:
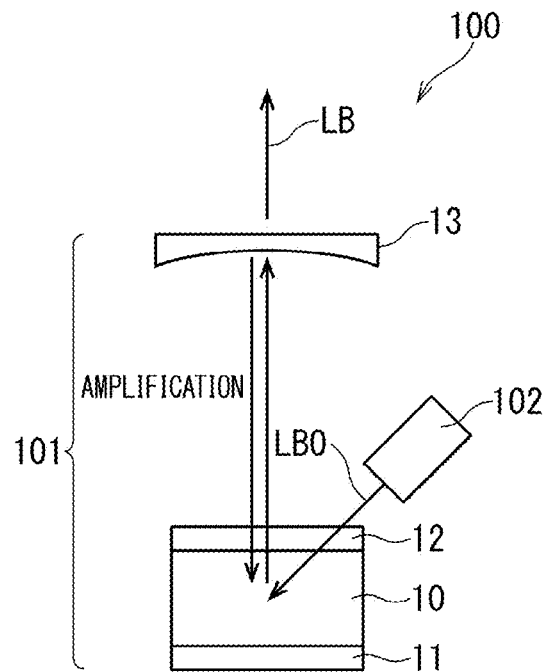
FIG. 1 schematically illustrates a vertical external-cavity surface-emitting laser 100 including an optical resonator 101 including a surface-emitting device 10 according to a first embodiment.

FIG. 1 schematically illustrates a vertical external-cavity surface-emitting laser (VECSEL) 100 including an optical resonator 101 comprising a surface-emitting device 10 according to a first embodiment of the present invention.

The vertical external-cavity surface-emitting laser 100 according to the present embodiment includes the optical resonator 101 and an excitation laser light source 102. The optical resonator 101 includes the surface-emitting device 10, a heat sink 11, a reflection film 12, and a resonant mirror 13.

In outline, the surface-emitting device 10 is a device having an emitter structure and a distributed Bragg reflector (DBR) structure, both of which are formed of a group 13 nitride semiconductor. In the vertical external-cavity surface-emitting laser 100, schematically, when the excitation laser light source 102 emits excitation laser light LB0 toward the surface-emitting device 10, excitation emission occurs in the surface-emitting device 10, and the light produced by the excitation emission resonates between the DBR structure (DBR layer 3, see FIG. 2) inside the surface-emitting device 10 and the resonant mirror 13. Then, the resultant amplified light whose phase is aligned is emitted as emitted laser light LB from the resonant mirror 13.

The heat sink 11 is provided for the surface-emitting device 10 placed thereon to absorb the heat generated by the operation of the vertical external-cavity surface-emitting laser 100 and dissipate the heat externally.

The reflection film 12 is formed on the upper surface of the surface-emitting device 10 and prevents the light that has been produced in the surface-emitting device 10 and then reflected off the resonant mirror 13 from being reflected off the upper surface of the surface-emitting device 10. The presence of the reflection film 12 allows the light reflected off the resonant mirror 13 to enter the surface-emitting device 10 with high transmission and to reach to the DBR layer 3 in the surface-emitting device 10.

The reflection film 12 may be made of, for example, $SiO_2$ with a thickness of approximately 0.02 µm to 0.2 µm. The reflection film 12 can be preferably formed by sputtering method publicly known.

The resonant mirror 13 is a half mirror that causes the light produced in the surface-emitting device 10 to resonate between the DBR layer 3 and itself and causes the light whose phase is aligned, which has been obtained by the resonance, to pass therethrough to the outside as emitted laser light LB. The resonant mirror 13 is arranged so as to preferably exhibit the resonance of the light having a designed output wavelength that has produced in the surface-emitting device 10.

The excitation laser light source 102 serves to produce the excitation laser light LB0 for causing excitation emission in the surface-emitting device 10. As the excitation laser light source 102, a commercially available light source may be used appropriately in accordance with a designed output wavelength in the vertical external-cavity surface-emitting laser 100 (a target emission wavelength in the surface-emitting device 10). When the designed output wavelength is set to visible light, it is preferable to use a GaN-based semiconductor laser capable of exciting the active layer 4 at a wavelength of an ultraviolet region, the second harmonic or third harmonic of Ti-sapphire laser light or Nd-YAG laser light, or the like.

Figure 2:
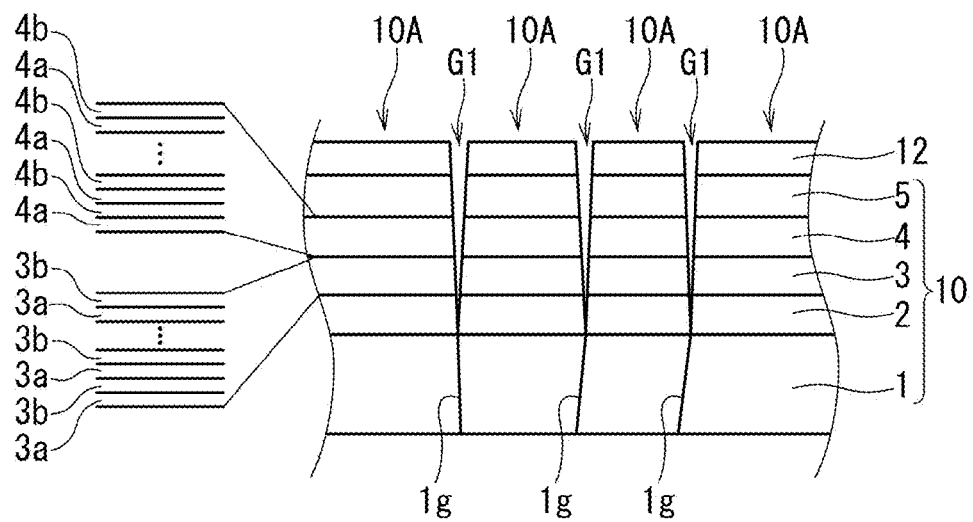
FIG. 2 is a schematic sectional view of a more detailed configuration of the surface-emitting device 10.
Figure 3:
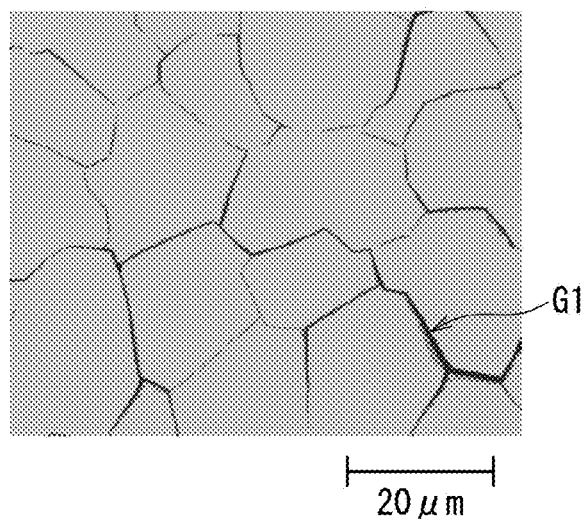
FIG. 3 illustrates a laser microscopic image of the upper surface of the surface-emitting device 10.
Figure 4:
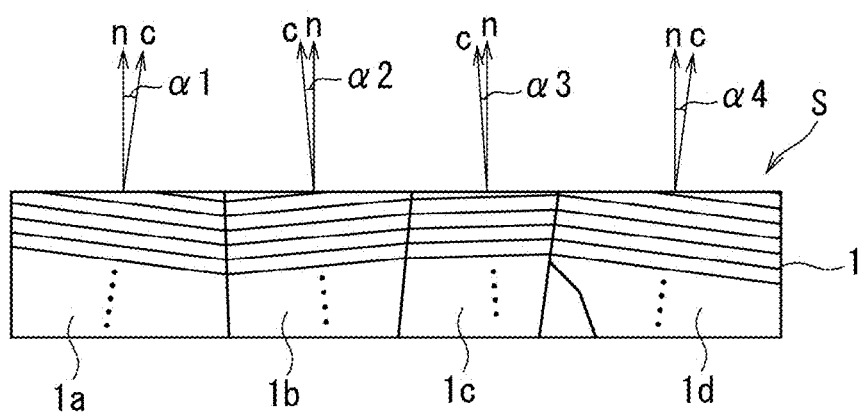
FIG. 4 is a view for explaining in detail an oriented GaN substrate 1 to be used as a base substrate in the surface-emitting device 10.

FIG. 2 is a schematic sectional view of a more detailed configuration of the surface-emitting device 10. FIG. 2 illustrates a state in which the reflection film 12 is formed on the upper surface of the surface-emitting device 10 (more specifically, the upper surface of a second GaN layer 5). FIG. 3 illustrates a laser microscopic image of the upper surface of the surface-emitting device 10. FIG. 4 is a view for explaining the details of the oriented GaN substrate 1 to be used as a base substrate in the surface-emitting device 10.

The surface-emitting device 10 includes a first GaN layer 2, the DBR layer 3, an active layer 4, and the second GaN layer 5 serving as a cap layer deposited in the stated order on the oriented GaN substrate 1 serving as a base substrate. The deposition structure of the first GaN layer 2, DBR layer 3, active layer 4, and second GaN layer 5 is also referred to as an emitter structure. The first GaN layer 2 to the second GaN layer 5 are preferably deposited by a metal organic chemical vapor deposition (MOCVD) method or may be deposited by another deposition technique.

The oriented GaN substrate 1 is one type of free-standing substrate of group 13 nitride, which is a polycrystalline free-standing GaN substrate having a c-plane orientation (c-axis oriented). Such an oriented GaN substrate 1 can be produced by, for example, a flux method disclosed in WO 2014/192911.

In more detail, the oriented GaN substrate 1 is a polycrystalline GaN substrate that can be regarded as follows: though the c-axis direction of each of GaN crystals divided by grain boundaries 1g may be slightly shifted (may vary somewhat) from the direction normal to the main surface (hereinafter, also merely referred to as a normal direction) of the oriented GaN substrate 1, the normal direction approximately coincides with the c-axis direction of GaN for the entire substrate. The average in-plane particle size of the individual GaN crystal is approximately 5 μm to 30 μm. In the present invention, a technique similar to the method for calculating an average particle size of an oriented polycrystalline sintered body, which is disclosed in WO 2014/192911, is used to calculate an average particle size of a GaN crystal.

For the oriented GaN substrate 1 illustrated in FIG. 4, for example, four GaN crystals 1a, 1b, 1c, and 1d are coupled horizontally in the figure, where the c-axis directions (indicated by arrows c) in the GaN crystals 1a, 1b, 1c, and 1d incline to the normal direction of the main surface S of the oriented GaN substrate 1 (which is indicated by an arrow n and coincides with the vertical direction in FIG. 4) respectively by angles α1, α2, α3, and α4.

The extent to which the c-axis of each individual GaN crystal varies (hereinafter, referred to as a degree of c-axis orientation) in the oriented GaN substrate 1 can be evaluated by the magnitude of a full width at half maximum for a peak of a (0002) plane (hereinafter, referred to as an RC half width) obtained by measurement (ω scan) of an X-ray rocking curve (XRC) of the (0002) plane of GaN to the main surface S. As the RC half width has a smaller value, the c-axis orientation is aligned more evenly (the substrate has a higher degree of orientation). In the present embodiment, an oriented GaN substrate 1 in which a value of such RC half width is 0.2 degrees or more and 1.0 degree or less is used to configure the surface-emitting device 10.

Although the planar size (diameter) and thickness of the oriented GaN substrate 1 are not particularly limited as long as no problem arises in the process for forming a surface-emitting device 10 and in the use of a surface-emitting device 10, for example, illustrated here is an oriented GaN substrate having a diameter of 2 in. to 6 in. and a thickness of approximately 400 μm to 1000 μm.

The first GaN layer 2 preferably has a thickness of approximately 0.02 μm to 3 μm.

The DBR layer 3, which has a DBR structure, is a part that resonates laser light between the resonant mirror 13 and itself. The DBR layer 3 is formed of a first unit reflection layer 3a and a second unit reflection layer 3b deposited repeatedly and alternately. The first unit reflection layer 3a is formed of a group 13 nitride having a composition $In_xAl_{1-x}N$ (0≤x<1) and is preferably formed with a thickness of approximately 35 nm to 65 nm. The second unit reflection layer 3b is made of GaN and is preferably formed with a thickness of approximately 30 nm to 60 nm.

The DBR layer 3 is preferably formed by deposition of 10 to 50 layers of each of the first unit reflection layer 3a and the second unit reflection layer 3b. An actual film thickness is appropriately determined in accordance with the designed output wavelength in the surface-emitting device 10.

The active layer 4 is a part that mainly emits light in the surface-emitting device 10. The surface-emitting device 10 in the present embodiment includes the active layer 4 having a multiple quantum well (MQW) structure including a first unit active layer 4a and a second unit active layer 4b deposited repeatedly and alternately. The first unit active layer 4a has a composition $In_yGa_{1-y}N$ (0<y<1) and exhibits n type by an n-type dopant (for example, Si) being doped at an atomic concentration of approximately $1 \times 10^{18}/cm^3$ to $1 \times 10^{19}/cm^3$. The second unit active layer 4b is made of GaN and exhibits n type by an n-type dopant (for example, Si) being doped at an atomic concentration of approximately $5 \times 10^{17}/cm^3$ to $5 \times 10^{18}/cm^3$. In other words, the surface-emitting device 10 according to the present embodiment includes an active layer 4 having an InGaN/GaN multiple quantum well structure.

In such a case, the active layer 4 is configured to emit light having a desired wavelength through selection of a value of an In composition ratio y in the first unit active layer 4a. In other words, the surface-emitting device 10 emits light having a wavelength according to the In composition ratio y of the first unit active layer 4a. This means that the wavelength (designed output wavelength) of the light desired to be emitted from the surface-emitting device 10 can be varied by varying the In composition ratio y in the first unit active layer 4a in the production of the surface-emitting device 10. For example, in the case where y=0.25, light having an emission wavelength of approximately 530 nm can be obtained.

The active layer 4 is preferably configured by deposition of 8 to 20 layers of each of the first unit active layer 4a having a thickness of approximately 2 nm to 10 nm and the second unit active layer 4b having a thickness of approximately 5 nm to 15 nm.

The second GaN layer 5 is provided as a cap layer. The second GaN layer 5 preferably has a thickness of approximately 0.02 μm to 0.2 μm.

In the present embodiment, as described above, the first GaN layer 2, DBR layer 3, active layer 4, and second GaN layer 5 constituting an emitter structure are formed on the oriented GaN substrate 1. Though not illustrated in FIG. 1, the respective layers are not formed to have a uniform crystal orientation on the oriented GaN substrate 1 but, as illustrated in FIG. 2, are grown on the individual GaN crystals (in the illustration of FIG. 4, the GaN crystals 1*a*, 1*b*, 1*c*, and 1*d*) constituting the oriented GaN substrate 1 so as to conform to their respective GaN crystal orientations. Letting the deposition structure of the first GaN layer 2, DBR layer 3, active layer 4, and second GaN layer 5 formed on the individual GaN crystal (a portion of the emitter structure above the individual GaN crystal) be a unit deposition part 10A, the average in-plane particle size of the unit deposition part 10A is approximately 5 µm to 30 µm that is comparable to the average particle size of the individual GaN crystal of the oriented GaN substrate 1.

The unit deposition part 10A is epitaxially grown conforming to the c-axis that is the crystal orientation of the GaN crystal that serves as its base, and thus has a good crystalline quality. This means that the respective unit deposition parts 10A have small variations in composition, and accordingly, that there are small variations in wavelength of light emissions from the respective unit deposition parts 10A and in the half width in the wavelength profile for the light emissions. The light emission from the surface-emitting device 10 is a superposition of light emissions of the respective unit deposition parts 10A, and thus, the light emission from the surface-emitting device 10 has a desired emission wavelength, high luminance, and small half width in the waveform profile. For example, a half width of 0.2 nm or less can be obtained.

In the present embodiment, the conditions for growing the respective layers constituting the surface-emitting device 10 are appropriately adjusted to form, in the surface-emitting device 10, grooves G1 extending along the grain boundaries 1*g* of the oriented GaN substrate as illustrated in FIG. 2. The grooves G1 are exaggerated for easy understanding in FIG. 2. The grooves G1 are actually observed as illustrated in, for example, FIG. 3, and have a width of approximately 10 nm to 100 nm. The positions at which the grain boundaries 1*g* are formed are random (irregular) in the oriented GaN substrate 1, and accordingly, the positions at which the grooves G1 are formed are random. Although the grooves G1 reach the first GaN layer 2 in FIG. 2, all the grooves G1 do not necessarily reach the first GaN layer 2.

It can be said that the surface-emitting device 10 according to the present embodiment, which has the grooves G1 in such a manner, is an aggregation of unit deposition parts 10A each of which has a planar size substantially identical to or a slightly smaller than that of the base GaN crystal of the oriented GaN substrate 1 and grows conforming to the crystal orientation of the base GaN crystal. Alternatively, it can be said that though the c-axis directions of the respective unit deposition parts 10A of the surface-emitting device 10 may shift (vary somewhat) from the normal direction, for the entire surface-emitting device 10, a large number of unit deposition parts 10A are provided on the oriented GaN substrate 1 that is a common base substrate in such a manner that the normal direction approximately coincides with the c-axis directions.

Although FIG. 1 illustrates the reflection film 12 formed uniformly on the upper surface of the oriented GaN substrate 1, in actuality, the reflection film 12 is formed on the individual unit deposition parts 10A and is not formed to fill the grooves G1, as illustrated in FIG. 2. In the description below, the unit deposition part 10A also refers to a unit deposition part 10A including a reflection film 12 formed thereon in the manner as described above.

The surface-emitting device 10 having the grooves G1 formed between the individual unit deposition parts 10A has no strains accumulated inside the emitter structure including the active layer 4. In other words, the surface-emitting device 10 realizes a surface-emitting device structure in which strains in the emitter structure (particularly in the active layer 4) are relieved. Relieving such distortions enables the surface-emitting device 10 according to the present embodiment to have a reduced piezo polarization effect compared with, for example, a surface-emitting device including respective layers (without grooves) formed uniformly on a substrate. The surface-emitting device 10 thus has a preferably reduced blueshift caused by a piezo electric field inside the active layer 4 when the intensity of the excitation laser light is increased. This means that the surface-emitting device 10 can emit light having a designed output wavelength with high efficiency.

The surface-emitting device 10 according to the present embodiment can be regarded as an excitation medium for an optical excitation semiconductor laser that can emit the light having a wavelength corresponding to the composition of the active layer 4 and has high light emission efficiency even the excitation laser light has high intensity.

The vertical external-cavity surface-emitting laser 100 having such a surface-emitting device 10 can efficiently emit light having a designed output wavelength if the excitation laser light has high intensity.

Method for Manufacturing Surface-Emitting Device

A method for manufacturing a surface-emitting device 10 will now be described. The description below is targeted for the production of the surface-emitting device 10 by a so-called multi-patterning process of preparing an oriented GaN substrate 1 as a mother substrate (wafer) and simultaneously manufacturing a large number of surface-emitting devices 10.

The flux method (Na flux method) as described above is illustrated here as the method for producing an oriented GaN substrate 1.

In the flux method, an oriented alumina substrate that is an oriented polycrystalline substrate is first prepared.

The oriented alumina substrate is formed of a polycrystalline alumina sintered body in which the c-axis of an alumina ($Al_2O_3$) particle having an average particle size of approximately 5 µm to 30 µm is oriented approximately in the normal direction of the substrate. Although the alumina substrate may have any size as long as it can be treated in a subsequent process, for example, an alumina substrate having a diameter of 2 in. to 8 in. and a thickness of approximately 200 µm to 2000 µm is preferably used.

On one main surface of the oriented alumina substrate, a GaN low-temperature buffer layer having a thickness of approximately 20 nm to 30 nm and a GaN layer having a thickness of approximately 1 µm to 5 µm are formed in order by the MOCVD method using hydrogen as a carrier gas and using trimethyl gallium (TMG) and ammonia as source gases to form, thus achieving a seed substrate. The temperature for forming the GaN low-temperature buffer layer may be approximately 510° C. to 530° C., and the temperature for forming the GaN layer may be approximately 1050° C. to 1150° C.

This seed substrate is charged into an alumina crucible together with a metal Ga and a metal Na each having a weight corresponding to the size of the alumina substrate. Subsequently, the alumina crucible is placed in a heat-resistant metal growing vessel and is sealed. The growing vessel is placed in a heat-resistance, pressure-tight crystal growing furnace. The temperature in the furnace is set to 750° C. to 900° C., and a nitrogen gas is introduced into the furnace to set the pressure in the furnace to 3 MPa to 5 MPa. The growing vessel is then held for 50 hours to 100 hours while being horizontally rotated, thus growing a thick GaN layer having a thickness of approximately 250 µm to 500 µm. In such a case, the thick GaN layer is obtained as an oriented polycrystalline layer in which crystal grains have been c-axis oriented conforming to the crystal orientations of individual crystal grains constituting an alumina substrate serving as a base.

The oriented alumina substrate is then removed by, for example, grinding with a grinder, and subsequently, the thick GaN layer is polished to a desired thickness by a known technique such as surface polishing (lap polishing) with a diamond abrasive grain, thus achieving an oriented GaN substrate 1.

The thick GaN layer formed on the oriented alumina substrate is also a polycrystalline layer and contains grain boundaries 1g though the c-axis of each crystal grain is largely oriented in the normal direction of the substrate, conforming to the oriented alumina substrate. Therefore, the oriented GaN substrate 1 to be finally obtained has this feature.

In the present embodiment, the oriented GaN substrate 1 in which the RC half width of GaN is 0.2 degrees to 1.0 degree in XRC measurement (ω scan) is used to form the surface-emitting device 10, as described above. To obtain such an oriented GaN substrate 1 preferably (with high yield), the conditions for producing an alumina sintered body described above are preferably controlled appropriately. Specifically, an alumina sintered body is preferably obtained as follows. A commercially-available, plate-shaped alumina powder is shaped into a sheet-shaped oriented compact by a technique using shear force, such as tape molding, extrusion molding, or doctor blading. Then, a large number of such compacts are deposited to have a desired thickness to prepare a sheet-shaped compact subjected to press molding. Subsequently, a first firing step is performed in which the compact is fired by pressurized sintering such as hot pressing on the conditions involving a firing temperature of 1500° C. to 1800° C., a firing time of 30 minutes to 5 hours, and a contact pressures of 100 kgf/cm$^2$ to 200 kgf/cm$^2$, and a second firing step is performed in which the compact is fired again by hot isostatic pressing (HIP) on the conditions involving a firing temperature of 1500° C. to 1800° C., a firing time of 2 hours to 5 hours, and a gas pressure of 1000 kgf/cm$^2$ to 2000 kgf/cm$^2$. It should be noted that if a yield is not taken into consideration, an alumina sintered body that satisfies the conditions of the half width may be selected from the alumina sintered bodies produced on appropriate conditions.

The prepared oriented GaN substrate 1 is placed on the susceptor in a given MOCVD furnace, and the temperature of the substrate is once raised to the range of 1150° C. to 1250° C. in the hydrogen atmosphere, followed by cleaning.

Subsequently, the first GaN layer 2, DBR layer 3, active layer 4, and second GaN layer 5 are deposited on the oriented GaN substrate 1 in the stated order by the MOCVD method. Si is doped in the formation of every layer. The DBR layer 3 is formed as a multilayer film of InAlN layers or AlN layers serving as the first unit reflection layers 3a and GaN layers serving as the second unit reflection layers 3b. The active layer 4 is formed to have an MQW structure of InGaN layers serving as the first unit active layers 4a and Si-doped GaN layers serving as the second unit active layers 4b.

Each layer may be formed to satisfy the following conditions. It should be noted that a group 15/group 13 gas ratio refers to a ratio of a supply amount of ammonia gas that is a group 15 source to a total supply amount of a group 13 source gas (TMG, TMA, TMI), which is expressed as a molar ratio. The formation temperature refers to the susceptor heating temperature in the present embodiment.

First GaN Layer 2:
Formation temperature: 1030° C. to 1130° C.;
Formation pressure: 30 kPa to 100 kPa;
Carrier gas: nitrogen and hydrogen;
Source gas: trimethyl gallium (TMG) and ammonia gas;
Group 15/group 13 gas ratio: 5000 to 10000.

DBR Layer 3:
Formation temperature: 700° C. to 800° C.;
Formation pressure: 10 kPa to 30 kPa;
Carrier gas: nitrogen;
Source gas of first unit reflection layer 3a: trimethylaluminum (TMA), trimethylindium (TMI: only in the formation of an InAlN layer), and ammonia gas;
Group 15/group 13 gas ratio: 2000 to 6000;
Source gas of second unit reflection layer 3b: trimethyl gallium (TMG) and ammonia gas;
Group 15/group 13 gas ratio: 4000 to 10000;
Repetitive number of pairs of first unit reflection layer 3a and second unit reflection layer 3b: 10 to 50.

Active Layer 4:
Formation temperature: 750° C. to 900° C.;
Formation pressure: 20 kPa to 100 kPa;
Carrier gas: nitrogen;
Source gas of first unit active layer 4a: trimethyl gallium (TMG), trimethylindium (TMI), and ammonia gas;
Dopant source: silane gas;
Group 15/group 13 gas ratio: 5000 to 15000;
Source gas of second unit active layer 4b: trimethyl gallium (TMG) and ammonia gas;
Dopant source: silane gas;
Group 15/group 13 gas ratio: 4000 to 10000;
Repetitive number of pairs of first unit reflection layer 4a and second unit reflection layer 4b: 8 to 20.

Second GaN Layer 5
Formation temperature: 950° C. to 1050° C.;
Formation pressure: 10 kPa to 100 kPa;
Carrier gas: nitrogen and hydrogen;
Source gas: trimethyl gallium (TMG) and ammonia gas;
Group 15/group 13 gas ratio: 5000 to 10000.

Satisfying these conditions can preferably form a surface-emitting device 10 including grooves G1 between unit deposition parts 10A on an oriented GaN substrate 1. More specifically, a deposited body obtained by the layer formation described above may be appropriately cut in a predetermined size.

As described above, in the present embodiment, the surface-emitting device forming a vertical external-cavity surface-emitting laser has an InGaN/GaN quantum well structure as an active layer and includes an oriented GaN substrate that is an oriented polycrystalline substrate and an emitter structure including grooves extending along the grain boundaries of the oriented GaN substrate. In the surface-emitting device having the configuration above, the presence of the grooves relieves strains in the emitter structure, thus reducing a piezo polarization effect. This preferably reduces a blueshift that is caused by an effect of shielding a piezo electric field inside the active layer when the intensity of excitation laser light is increased. Therefore, the vertical external-cavity surface-emitting laser including the surface-emitting device according to the present embodiment efficiently emits light having a designed output wavelength even when the excitation laser light has high intensity.

Second Embodiment

Although the surface-emitting device 10 according to the first embodiment described above, which includes the grooves G1 at random positions corresponding to the grain boundaries 1g of the oriented GaN substrate 1 that is a base substrate, relieves strains inside the device, the configuration of the surface-emitting device, particularly the manner of forming grooves is not limited to the one described in the first embodiment. For example, grooves may be formed regularly (periodically).

Figure 5A:
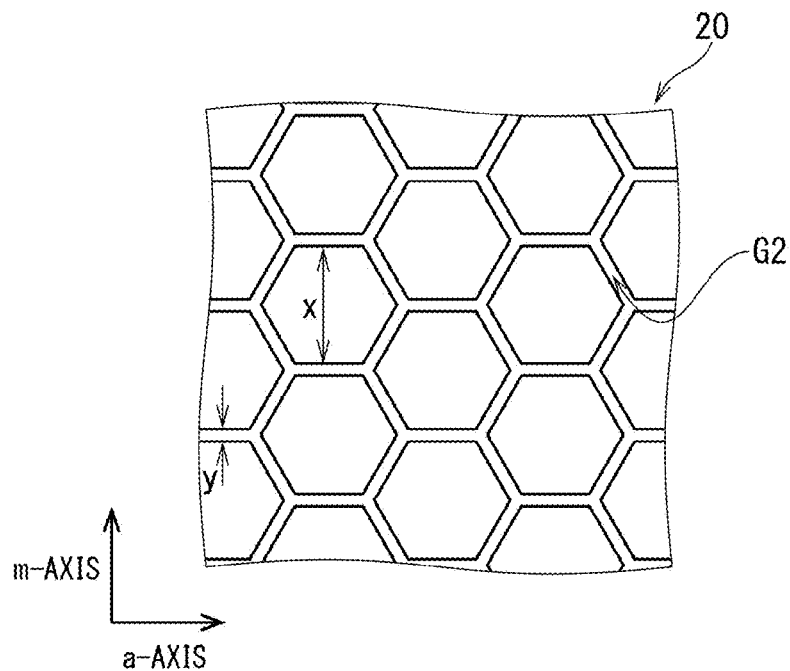
FIGS. 5A and 5B schematically illustrate a configuration of a surface-emitting device 20.
Figure 5B:
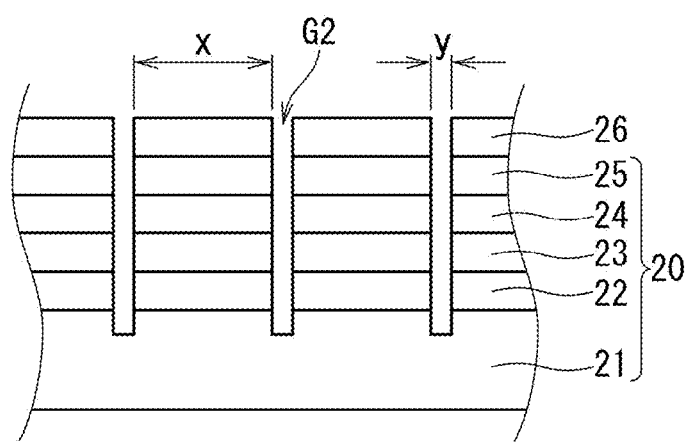

FIGS. 5A and 5B schematically illustrate the configuration of a surface-emitting device 20 according to the present embodiment. FIG. 5A is a top view of the surface-emitting device 20, and FIG. 5B is a sectional view of the surface-emitting device 20.

As illustrated in FIG. 5B, the surface-emitting device 20 according to the present embodiment includes a first GaN layer 22, a DBR layer 23, an active layer 24, and a second GaN layer 25 serving as a cap layer that are epitaxially grown and deposited in the stated order on a single crystal GaN substrate 21 having a c-plane orientation (c-axis oriented) that is a base substrate. As illustrated in FIGS. 5A and 5B, the surface-emitting device 20 additionally includes grooves G2 that extend from the second GaN layer 25 down to the single crystal GaN substrate 21.

FIG. 5B illustrates a state in which a reflection film 26 is formed on the upper surface of the surface-emitting device 20 (on the upper surface of the second GaN layer 25). More specifically, the reflection film 26 is formed only in the places including no grooves G2.

As the single crystal GaN substrate 21, a GaN free-standing substrate is used, in which the RC half width of a (0002) plane of GaN is less than 0.1 degrees. Although the planar size (diameter) and thickness of the single crystal GaN substrate 21 are not particularly limited as long as no problem arises in the process for forming the surface-emitting device 20 and in the use of the surface-emitting device 20, illustrated here is an oriented GaN substrate having a diameter of 2 in. to 6 in. and a thickness of approximately 330 µm to 1000 µm. The single crystal GaN substrate 21 may be a commercially available substrate or may be produced by, for example, depositing a GaN layer with a thickness of approximately 3 µm to 10 µm on sapphire.

The first GaN layer 22, DBR layer 23, active layer 24, and second GaN layer 25 respectively have compositions and thicknesses similar to those of the first GaN layer 2, DBR layer 3, active layer 4, and second GaN layer 5 of the surface-emitting device 10 according to the first embodiment. It can therefore be said that the surface-emitting device 20 according to the present embodiment is the same as the surface-emitting device 10 according to the first embodiment except for the base substrate. The DBR layer 23 is accordingly formed of a first unit reflection layer (not shown) and a second unit reflection layer (not shown) deposited repeatedly and alternately. These first unit reflection layer and second unit reflection layer constituting the DBR layer 23 are respectively formed with compositions, thicknesses, and a repetitive number similar to those of the first unit reflection layer 3a and second unit reflection layer 3b constituting the DBR layer 3. Also, the active layer 24 is formed of a first unit active layer (not shown) and a second unit active layer (not shown) deposited repeatedly and alternately. These first unit active layer and second unit active layer constituting the active layer 24 are formed with compositions, thicknesses, and a repetitive number similar to those of the first unit active layer 4a and second unit active layer 4b constituting the active layer 4.

Also in the present embodiment, the deposition structure of the first GaN layer 22, DBR layer 23, active layer 24, and second GaN layer 25 is also referred to as an emitter structure.

On the other hand, the manner of forming the grooves G2 differs from the manner of forming the grooves G1 in the surface-emitting device 10 according to the first embodiment. Specifically, while the surface-emitting device 10 according to the first embodiment randomly includes the grooves G1 correspondingly to the positions at which the grain boundaries 1g are located in the oriented GaN substrate 1, the surface-emitting device 20 according to the present embodiment has a configuration in which the grooves G2 are formed regularly (periodically). The surface-emitting device 20 illustrated in FIG. 5A includes the grooves G2 arranged in a hexagonal lattice shape in plan view along the a-axis of the single crystal GaN substrate 21.

The grooves G2 arranged in the hexagonal lattice shape in plan view are defined uniquely by determining an interval x between the grooves G2, which is the distance between the grooves G2 in the m-axis direction orthogonal to the a-axis direction in the plane of the single crystal GaN substrate 21 and determining a width y of the groove G2, as illustrated in FIG. 5A. The interval x of the groove G2 is preferably 5 µm to 25 µm. The width y of the groove G2 is preferably 0.2 µm to 2 µm.

Although the grooves G1 are formed on their own in the formation of the respective layers constituting the emitter structure in the surface-emitting device 10 according to the first embodiment, the surface-emitting device 20 according to the present embodiment is produced as follows. The single crystal GaN substrate 21 is prepared, and thereon, respective layers constituting an emitter structure in the surface-emitting device 20 are epitaxially grown uniformly (including predetermined positions at which the grooves G2 are to be formed) on the conditions similar to the conditions for forming the respective layers constituting an emitter structure in the surface-emitting device 10 according to the first embodiment, thereby achieving a deposited body. Subsequently, the grooves G2 are formed by the photolithography process at the positions at which they are to be formed.

The surface-emitting device 20 is similar to the surface-emitting device 10 according to the first embodiment in that a plurality of unit deposition parts divided by the grooves G2 are included on the respective crystals of the single crystal GaN substrate 21 that is a base substrate in the emitter structure and that the c-axis orientation of each unit deposition part conforms to the single crystal GaN substrate 21. Also in the surface-emitting device 20, thus, no strains accumulate inside the emitter structure including the active layer 24 as in the surface-emitting device 10 according to the first embodiment. In other words, the surface-emitting device 20 also realizes the surface-emitting device structure in which strains are relieved in the emitter structure (particularly in the active layer 4). The surface-emitting device 20 according to the present embodiment, which can relieve such strains, has a reduced piezo polarization effect compared with a surface-emitting device in which the respective layers are formed uniformly (without grooves G2) on, for example, a single crystal GaN substrate. Consequently, the surface-emitting device 20 also preferably reduces a blue-shift caused by an effect of shielding a piezo electric field inside the active layer 24 when the intensity of the excitation laser light is increased.

The surface-emitting device 20 can be built in the vertical external-cavity surface-emitting laser 100, similarly to the surface-emitting device 10 according to the first embodiment. The surface-emitting device 20 according to the present embodiment can therefore be regarded as an excitation medium for an optical excitation semiconductor laser that can emit light having a wavelength corresponding to the composition of the active layer 24 and has high light emission efficiency even when the excitation laser light has high intensity, similarly to the surface-emitting device 10 according to the first embodiment.

Also with the surface-emitting device 20, the vertical external-cavity surface-emitting laser 100 can efficiently emit the light having a designed output wavelength even when the excitation laser light has high intensity.

The present embodiment uses a single crystal GaN substrate as a base substrate and requires the formation of grooves in the photolithography process. It can therefore be said that the first embodiment that uses an oriented GaN substrate, which is an oriented polycrystalline substrate that costs less than a single crystal GaN substrate, and involves no independent step of forming grooves is superior to the present embodiment in cost and productivity.

On the other hand, as is apparent from the manner of forming grooves G2, the surface-emitting device 20 according to the present embodiment can preferably adjust the conditions for forming the grooves G2 (for example, values of x and y for the grooves G2 having a hexagonal lattice shape in plan view) to optimize the intensity of the emitted laser light LB.

Modifications

The pattern of the regular (periodical) grooves in the surface-emitting device according to the second embodiment is not limited to a hexagonal lattice shape in plan view described and illustrated in the present embodiment and may be various patterns such as a triangular lattice shape, rectangular lattice shape, or any other shape.

In the formation of grooves by the photolithography process as in the second embodiment, the positions at which they are formed may have no periodicity. For example, grooves may be formed in the manner with regularity but no periodicity, or grooves may be formed so as to have no periodicity. Alternatively, portions with periodicity and portions without periodicity may coexist.

The surface-emitting devices 10 and 20 according to the first and second embodiments described above are each one component of the optical resonator 101 of the vertical external-cavity surface-emitting laser 100, which are not necessarily required to be one component. The surface-emitting devices 10 and 20 can be used independently of the optical resonator as a surface-emitting device that generates excitation emission. Also in this case, an effect of reducing a blueshift achieved by the forming of grooves can be achieved as in the embodiments above. In the independent use of the surface-emitting device 10 or 20, the surface-emitting device 10 or 20 is not necessarily required to include the DBR layer 3 or 23.

EXAMPLES

Example 1, Example 2, and Comparative Example 1

The surface-emitting device 10 according to the first embodiment was produced as Example 1, the surface-emitting device 20 according to the second embodiment, in which the grooves G2 have a hexagonal shape in plan view, was produced as Example 2, and a surface-emitting device was produced as Comparative Example 1, which has a configuration similar to that of the surface-emitting device of Example 2 except for that no grooves G2 are processed. These surface-emitting devices were then individually built in the vertical external-cavity surface-emitting laser 100, and their output characteristics were evaluated.

In the production of the surface-emitting device 10, first, an oriented GaN substrate 1 was prepared, which had a 2-inch diameter, a 400-μm thickness, and a 20-μm average in-plane particle size of an individual GaN crystal. This oriented GaN substrate 1 had a surface roughness RMS of 0.5 nm and an RC half width of 1.0 degree.

This oriented GaN substrate 1 was placed on a susceptor in a metal organic chemical vapor deposition furnace (MOCVD furnace), and the temperature of the substrate was raised to 1100° C. using nitrogen and hydrogen as carrier gases, thereby growing a first GaN layer 2 with a thickness of 50 nm using TMG and ammonia as source gases.

After the formation of the first GaN layer 2, the temperature of the substrate was then lowered to 800° C., and an $In_{0.18}Al_{0.82}N$ layer having a thickness of 55 nm and a GaN layer having a thickness of 50 nm were alternated using nitrogen as a carrier gas and TMG, TMA, TMI, and ammonia as source gases, thereby forming a total of 20 layer pairs. As a result, a DBR layer 3 including the $In_{0.18}Al_{0.82}N$ layer as the first unit reflection layer 3a and the GaN layer as the second unit reflection layer 3b was formed.

After the formation of the DBR layer 3, the temperature of the substrate was then lowered to 750° C., and an n-type $In_{0.25}GaN_{0.75}$ layer having a thickness of 4 nm and an n-type GaN layer having a thickness of 8 nm were alternated using nitrogen as a carrier gas and TMG, TMI, and ammonia as source gases, thereby forming a total of 15 layer pairs. As a result, an active layer 4 having an MQW structure, which includes the $In_{0.25}GaN_{0.75}$ layer as the first unit active layer 4a and the GaN layer as the second unit active layer 4b, was formed.

In the use of the $In_{0.25}GaN_{0.75}$ layer as the first unit active layer 4a, the designed output wavelength of the surface-emitting device 10 is 530 nm.

After the formation of the active layer 4, nitrogen was used as a carrier gas and TMG and ammonia were used as source gases while keeping the temperature of the substrate constant, thereby forming a second GaN layer 5 with a thickness of 50 nm as a cap layer.

After the formation of the second GaN layer 5, the temperature of the substrate was lowered to room temperature in the nitrogen atmosphere, and then, the resultant deposited structure was taken out of the MOCVD furnace.

The observation of the surface of the deposited structure (the upper surface of the second GaN layer 5) under a laser microscope revealed that grooves G1 were present in the distribution similar to the distribution of grain boundaries 1g in the surface of the oriented GaN substrate 1. The planar size of an individual unit deposition part 10A was comparable to the in-plane size of an individual GaN crystal of the oriented GaN substrate 1.

The resultant deposited structure was cut into 10-mm square pieces, thereby achieving a surface-emitting device 10.

In the production of the surface-emitting device 10 according to Example 2, a single crystal GaN substrate 21 having a 2-inch diameter and a 400-μm thickness was first prepared, and a first GaN layer 22, a DBR layer 23, an active layer 24, and a second GaN layer 25 were formed on the same formation conditions as the formation conditions of the first GaN layer 2, DBR layer 3, active layer 4, and second GaN layer 5 in Example 1. Grooves G2 were formed in the resultant deposited structure by the photolithography process. In this formation, x=20 µm, y=2 µm, and the depth of the groove G2 was set to approximately 0.5 µm that allows the groove to reach the single crystal GaN substrate 21.

The resultant deposited structure was cut into 10-mm square pieces, thereby achieving a surface-emitting device 20.

A surface-emitting device according to a comparative example was formed as in Example 2 except for that the formation of the grooves G2 was omitted.

A SiO$_2$ film serving as the reflection film 12 was formed with a thickness of approximately 0.1 µm on the surface of each surface-emitting device by sputtering, and subsequently, the surface-emitting device was built in an optical resonator 101 of a vertical external-cavity surface-emitting laser 100 before evaluating output characteristics. In the optical resonator 101, the arrangements of a resonant mirror 13 and the surface-emitting device are determined to allow the light having a wavelength of 530 nm, which is a designed output wavelength, to resonate.

A third harmonic (having a wavelength of 355 nm) of a Nd-YAG laser was used as an excitation laser light source 102, and excitation laser light LB0 is focused to a diameter of approximately 0.2 mm and then applied to the surface of the surface-emitting device.

The intensity of the excitation laser light LB0 was varied within the range of 50 mW to 600 mW, and the intensity of the emitted laser light LB emitted from the optical resonator 101 was obtained by a photodiode in the wavelength range of 530 nm±2 nm.

FIG. 6 is a graph showing the relationship between the intensity of the excitation laser light LB0 and the intensity of the emitted laser light LB in Example 1, Example 2, and Comparative Example 1.

As shown in FIG. 6, in Example 1, the intensity of the emitted laser light LB is roughly proportional to the intensity of the excitation laser light LB0. In Comparative Example 1, contrastingly, although the intensity of the emitted laser light LB was comparable to or somewhat higher than that of Example 1 within the range where the intensity of the excitation laser light LB0 is 100 mW or lower, was lower than that of Example 1 within the range in which the intensity of the excitation laser light LB0 is 200 mW or higher, and decreased sharply within the range in which the excitation laser light LB0 is 400 mW or higher.

It is considered that the intensity of the vertical external-cavity surface-emitting laser 100 according to Comparative Example 1 decreased as described above because the wavelength of the light emitted from the surface-emitting device according to Comparative Example 1 became shorter than 530 nm, which is a designed output wavelength, due to a blueshift caused in the light, thus preventing amplification of the light in the optical resonator 101.

The intensity of the emitted laser light LB being proportional to the intensity of the excitation laser light LB0 in Example 1 means that no blueshift occurs in the light emitted from the surface-emitting device 10 in the vertical external-cavity surface-emitting laser 100 according to Example 1, and accordingly, the optical resonator 101 preferably amplifies 530 nm, which is a designed output wavelength. This indicates that the configuration of the surface-emitting device 10 used in Example 1 is effective at reducing a blueshift.

In Example 2, the intensity of the emitted laser light LB was roughly proportional to the intensity of the excitation laser light LB0 as in Example 1 within the range where the intensity of the excitation laser light LB0 is 400 mW or lower, and there was a small difference in intensity from that of Example 1 within the range of 200 mW or less. Within the range where the excitation laser light LB0 is 500 mW or higher, however, the intensity reduced sharply to be comparable to that of Comparative Example 1.

The surface-emitting device 20 used in Example 2 is the surface-emitting device according to Comparative Example 1 in which the grooves G2 are formed. The results of Example 2 therefore indicate that in the use of the configuration including the grooves G2 as in the surface-emitting device 20, an effect of reducing a blueshift was conspicuous compared with the surface-emitting device including no grooves used in Comparative Example 1, though to a limited extent compared with Example 1.

Example 3

As Example 3, a plurality of surface-emitting devices 10 were produced on the same conditions as those of the surface-emitting device 10 according to the first embodiment except for that an average in-plane particle size of an individual GaN crystal of an oriented GaN substrate 1 (hereinafter, merely referred to as an average particle size of the oriented GaN substrate 1) was varied within the range of 0.3 µm to 70 µm. Each of the surface-emitting devices 10 was then built in a vertical external-cavity surface-emitting laser 100, and the relationship between the average particle size of the oriented GaN substrate 1 and the intensity of emitted laser light LB emitted from the vertical external-cavity surface-emitting laser 100 was evaluated. The value of the RC half width of a (0002) plane of each oriented GaN substrate 1 fell within the range of 0.8 degrees to 1.2 degrees.

The excitation laser light LB0 was focused to a diameter of approximately 0.2 mm and applied to the surface of the surface-emitting device 10, with the intensity of the light set to 500 mW.

Figure 7:
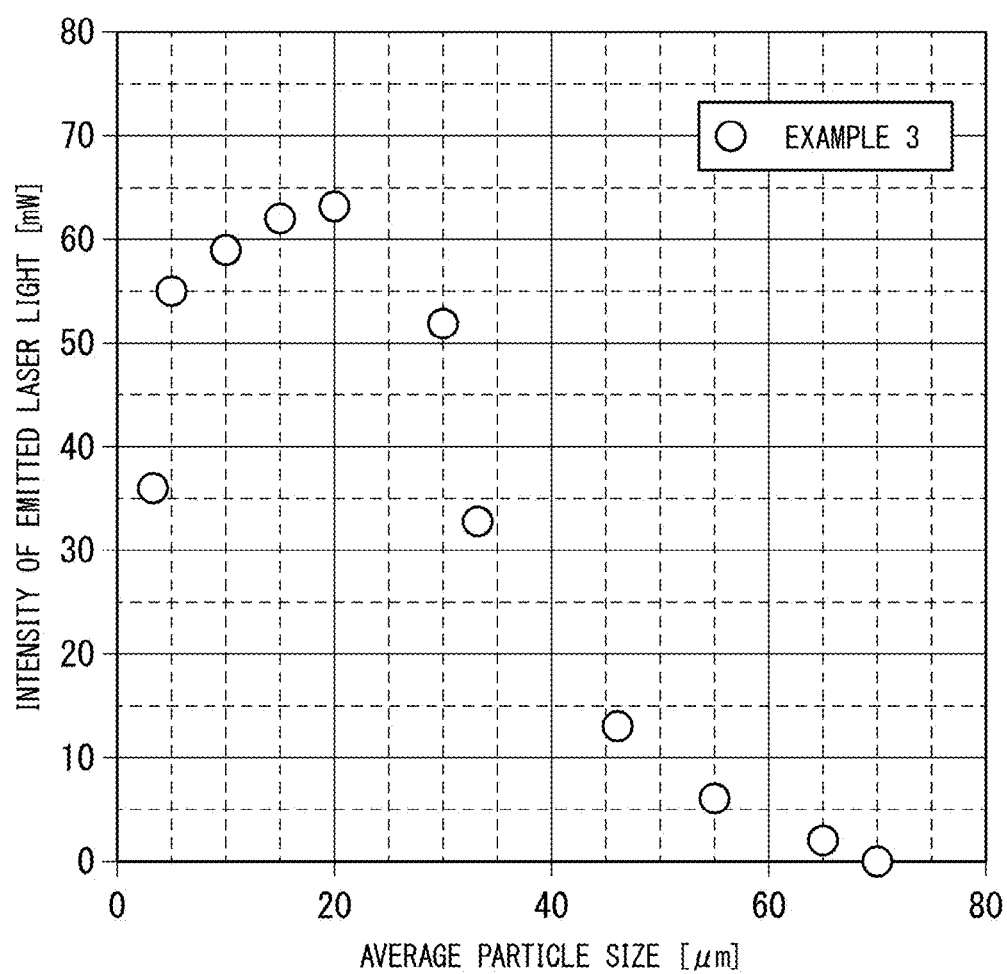
FIG. 7 is a graph showing a relationship between an average particle size of an oriented GaN substrate 1 and the intensity of emitted laser light LB in Example 3.

FIG. 7 is a graph showing the relationship between the average particle size of the oriented GaN substrate 1 and the intensity of the emitted laser light LB in Example 3.

As shown in FIG. 7, the intensity of the emitted laser light LB increased within the range in which the average particle size of the oriented GaN substrate 1 is 5 µm to 30 µm. On the other hand, the intensity was not achieved sufficiently within the ranges in which the average particle size of the oriented GaN substrate 1 is less than 5 µm and more than 30 µm.

These results indicate that an oriented GaN substrate having an average particle size of 5 µm or more and 30 µm or less is preferably used as the oriented GaN substrate 1 in the production of the surface-emitting device 10 according to the first embodiment.

The reason why the intensity of the emitted laser light LB is low when the oriented GaN substrate 1 has an average particle size of less than 5 µm is conceivably as follows. Because of a relatively high density of the grain boundary 1g of the oriented GaN substrate 1, the grooves G1 were formed on the grain boundaries 1g at small intervals, and the active layer 4 having an MQW structure grown in the c-plane orientation, which emits light with a designed output wavelength in the surface-emitting device 10, had a small area.

The reason why the intensity of the emitted laser light LB is low when the oriented GaN substrate 1 has an average particle size exceeding 30 µm is conceivably as follows. The grooves G1 were formed on the grain boundaries 1g of the oriented GaN substrate 1 at large intervals, and accordingly, the strains were not relieved sufficiently in the active layer 4 having an MQW structure in the surface-emitting device 10. This caused a blueshift in the light emitted from the active layer 4, and the emitted light was not amplified in the optical resonator 101.

Example 4

A plurality of surface-emitting devices 10 were produced on the same conditions as those of the surface-emitting device 10 according to the first embodiment except for that the value of the RC half width of a (0002) plane of an oriented GaN substrate 1 was varied within the range of 0.1 degrees to 2.8 degrees in Example 4. Each of the surface-emitting devices 10 was then built in a vertical external-cavity surface-emitting laser 100, and the relationship between the RC half width of the (0002) plane of the oriented GaN substrate 1 and the intensity of emitted laser light LB emitted from the vertical external-cavity surface-emitting laser 100 was evaluated. The average particle size of each oriented GaN substrate 1 fell within the range of 18 μm to 22 μm.

The excitation laser light LB0 was focused to a diameter of approximately 0.2 mm and applied to the surface of the surface-emitting device 10, with the intensity of the light set to 500 mW.

Figure 8:
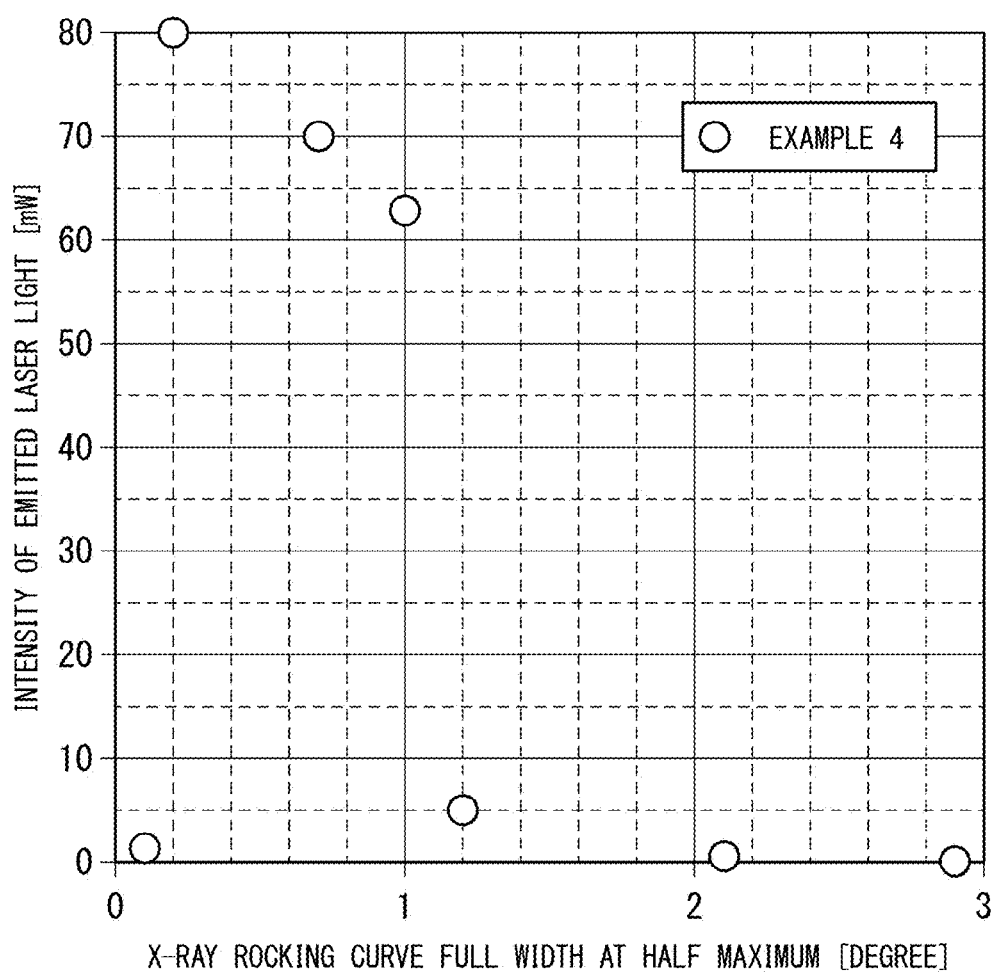
FIG. 8 is a graph showing a relationship between a value of an RC full width at half maximum of a (0002) plane of an oriented GaN substrate 1 and the intensity of emitted laser light LB in Example 4.

FIG. 8 is a graph showing the relationship between the value of the RC half width of the (0002) plane of the oriented GaN substrate 1 and the intensity of the emitted laser light LB in Example 4.

As shown in FIG. 8, the intensity of the emitted laser light LB increased within the range in which the RC half width of the (0002) plane of the oriented GaN substrate 1 is 0.2 degrees or more and 1.0 degree or less. On the other hand, intensity was not achieved sufficiently within the ranges in which the RC half width of the (0002) plane of the oriented GaN substrate 1 is less than 0.2 degrees and more than 1.0 degree.

The reason why the emitted laser light LB has low intensity when the RC half width of the (0002) plane of the oriented GaN substrate 1 exceeds 1.0 degree is conceivably as follows. The DBR structure was not formed in parallel with a main surface S of the oriented GaN substrate 1 in the DBR layer 3, and accordingly, the emitted light was not amplified sufficiently in the optical resonator 101.

What is claimed is:

1. A surface-emitting device for an excitation medium of a vertical external-cavity surface-emitting laser, the surface-emitting device comprising:
a base substrate made of GaN and c-axis oriented; and
an emitter structure formed of a group 13 nitride semiconductor and provided on said base substrate,
wherein
said base substrate is an oriented polycrystalline free-standing substrate,
said emitter structure is formed of a plurality of unit deposition parts, and each of said plurality of unit deposition parts is provided on said base substrate and includes a DBR layer having a distributed Bragg reflection structure and an active layer that has a multiple quantum well structure and generates excitation emission in response to irradiation with external laser light,
wherein a c-axis orientation of each of said plurality of unit deposition parts conforms to the c-axis orientation of said base substrate located directly below said plurality of unit deposition parts, and
wherein grooves are formed between said plurality of unit deposition parts, wherein the grooves are formed at random positions.

2. The surface-emitting device according to claim 1, wherein
each of said plurality of unit deposition parts is provided, on a corresponding crystal among crystals of said oriented polycrystalline free-standing substrate, conforming to a c-axis orientation of said corresponding crystal, and
said grooves are located along grain boundaries on a main surface of said oriented polycrystalline free-standing substrate.

3. The surface-emitting device according to claim 2, wherein an average in-plane particle size of each of GaN crystals of said oriented polycrystalline free-standing substrate is 5 μm to 30 μm.

4. The surface-emitting device according to claim 2, wherein a value of an X-ray rocking curve full width at half maximum of a GaN (0002) plane in said oriented polycrystalline free-standing substrate is 0.2 degrees to 1.0 degree.

5. The surface-emitting device according to claim 1, wherein
each of said unit deposition parts includes
a first GaN layer provided on said base substrate,
said DBR layer provided on said first GaN layer,
said active layer being n type and provided on said DBR layer, and
a second GaN layer provided on said active layer,
said DBR layer has said distributed Bragg reflection structure in which a first unit reflection layer formed of a group 13 nitride having a composition $In_xAl_{1-x}N$ ($0 \leq x < 1$) and a second unit reflection layer made of GaN are deposited repeatedly and alternately, and
said active layer has said multiple quantum well structure in which a first unit active layer of n type having a composition $In_yGa_{1-y}N$ ($0 < y < 1$) and a second unit active layer of n type made of GaN are deposited repeatedly and alternately.

6. The surface-emitting device according to claim 1, wherein said grooves extend from a surface of said device toward said base substrate.

7. A vertical external-cavity surface-emitting laser comprising:
an optical resonator including
a surface-emitting device for an excitation medium, and
a resonant mirror, and
an excitation light source,
said surface-emitting device including
a base substrate made of GaN and c-axis oriented, and
an emitter structure formed of a group 13 nitride semiconductor and provided on said base substrate,
wherein
said base substrate is an oriented polycrystalline free-standing substrate,
said emitter structure is formed of a plurality of unit deposition parts, and each of said plurality of unit deposition parts is provided on said base substrate and includes a DBR layer having a distributed Bragg reflection structure and an active layer having a multiple quantum well structure,
said excitation light source irradiates said active layer of said surface-emitting device with excitation laser light to cause said active layer to generate excitation emission,
a c-axis orientation of each of said plurality of unit deposition parts conforms to the c-axis orientation of said base substrate located directly below said plurality of unit deposition parts, grooves are formed between said plurality of unit deposition parts, wherein the grooves are formed at random positions, and said resonant mirror resonates the excitation emission generated in said active layer between said DBR layer of said surface-emitting device and said resonant mirror.

8. The surface-emitting device according to claim 7, wherein said grooves extend from a surface of said device toward said base substrate.

9. A method for manufacturing a surface-emitting device for an excitation medium of a vertical external-cavity surface-emitting laser, the method comprising the steps of:
(a) preparing a base substrate made of GaN and c-axis oriented; and
(b) forming an emitter structure formed of a group 13 nitride semiconductor on said base substrate,
wherein said base substrate is an oriented polycrystalline free-standing substrate,
in said step (b), said emitter structure is formed such that said emitter structure includes
a plurality of unit deposition parts, each of which is provided on said base substrate and includes a DBR layer having a distributed Bragg reflection structure and an active layer that has a multiple quantum well structure and generates excitation emission in response to irradiation with external laser light, and
grooves formed between said plurality of unit deposition parts, wherein the grooves are formed at random positions, and
a c-axis orientation of each of said plurality of unit deposition parts conforms to the c-axis orientation of said base substrate located directly below said plurality of unit deposition parts.

10. The method according to claim 9, wherein
in said step (b), said plurality of unit deposition parts are grown such that each of said deposition parts conforms to a c-axis orientation of said corresponding crystal on a corresponding crystal among crystals of said oriented polycrystalline free-standing substrate, and that said grooves are formed along grain boundaries on a main surface of said oriented polycrystalline free-standing substrate.

11. The method according to claim 10, wherein an average in-plane particle size of each of GaN crystals of said oriented polycrystalline free-standing substrate is 5 μm to 30 μm.

12. The method according to claim 10, wherein a value of an X-ray rocking curve full width at half maximum of a GaN (0002) plane in said oriented polycrystalline free-standing substrate is 0.2 degrees to 1.0 degree.

13. The method according to claim 9, wherein
said step (b) includes the steps of
(b-1) forming a first GaN layer on said base substrate,
(b-2) forming said DBR layer on said first GaN layer;
(b-3) forming said active layer on said DBR layer, and
(b-4) forming a second GaN layer on said active layer,
in said step (b-2), a first unit reflection layer formed of a group 13 nitride having a composition $In_xA_{1-x}N$ (0≤x<1) and a second unit reflection layer made of GaN are deposited repeatedly and alternately to form said DBR layer, and
in said step (b-3), a first unit active layer formed of a group 13 nitride having a composition $In_yGa_{1-y}N$ (0<y<1) and a second unit active layer made of GaN are deposited repeatedly and alternately while being doped with an n-type dopant to form said active layer of n type.

14. The surface-emitting device according to claim 9, wherein said grooves extend from a surface of said device toward said base substrate.

15. A surface-emitting device comprising:
a base substrate made of GaN and c-axis oriented; and
an emitter structure formed of a group 13 nitride semiconductor and provided on said base substrate,
wherein
said base substrate is an oriented polycrystalline free-standing substrate,
said emitter structure is formed of a plurality of unit deposition parts, and each of said plurality of unit deposition parts is provided on said base substrate and includes a DBR layer having a distributed Bragg reflection structure and an active layer that has a multiple quantum well structure and generates excitation emission in response to irradiation with external laser light,
a c-axis orientation of each of said plurality of unit deposition parts conforms to the c-axis orientation of said base substrate located directly below said plurality of unit deposition parts, and
grooves are formed between said plurality of unit deposition parts, wherein the grooves are formed at random positions.

16. The surface-emitting device according to claim 15, wherein
each of said plurality of unit deposition parts is provided, on a corresponding crystal among crystals of said oriented polycrystalline free-standing substrate, conforming to a c-axis orientation of said corresponding crystal, and
said grooves are located along grain boundaries on a main surface of said oriented polycrystalline free-standing substrate.

17. The surface-emitting device according to claim 16, wherein an average in-plane particle size of each of GaN crystals of said oriented polycrystalline free-standing substrate is 5 μm to 30 μm.

18. The surface-emitting device according to claim 16, wherein a value of an X-ray rocking curve full width at half maximum of a GaN (0002) plane in said oriented polycrystalline free-standing substrate is 0.2 degrees to 1.0 degree.

19. The surface-emitting device according to claim 15, wherein
each of said unit deposition parts includes
a first GaN layer provided on said base substrate,
said active layer being n type and provided on said first GaN layer, and
a second GaN layer provided on said active layer, and
said active layer has said multiple quantum well structure in which a first unit active layer of n type having a composition $In_yGa_{1-y}N$ (0<y<1) and a second unit active layer of n type made of GaN are deposited repeatedly and alternately.

* * * * *